(12) United States Patent
Kobetsky et al.

(10) Patent No.: US 9,524,886 B2
(45) Date of Patent: Dec. 20, 2016

(54) BRUSH CORE AND BRUSH DRIVING METHOD

(75) Inventors: Robert G. Kobetsky, Chicago, IL (US); Daniel P. McDonald, Palatine, IL (US); Alan Varacins, Burlington, WI (US); David F. Hakala, El Dorado Hills, CA (US); Weijin Li, El Dorado Hills, CA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 192 days.

(21) Appl. No.: 12/775,314

(22) Filed: May 6, 2010

(65) Prior Publication Data

US 2010/0288305 A1 Nov. 18, 2010

Related U.S. Application Data

(60) Provisional application No. 61/178,843, filed on May 15, 2009.

(51) Int. Cl.
*B08B 7/00* (2006.01)
*H01L 21/67* (2006.01)

(52) U.S. Cl.
CPC .............................. *H01L 21/67046* (2013.01)

(58) Field of Classification Search
USPC ................................................ 134/6; 15/88.3
See application file for complete search history.

(56) References Cited

U.S. PATENT DOCUMENTS

| | | | |
|---|---|---|---|
| 4,083,906 A * | 4/1978 | Schindler et al. | 264/49 |
| 6,286,169 B1 * | 9/2001 | D'Costa et al. | 15/52.1 |
| 2002/0100132 A1 | 8/2002 | McMullen et al. | |
| 2007/0084004 A1 * | 4/2007 | Shizawa et al. | 15/77 |
| 2007/0209135 A1 * | 9/2007 | Chen et al. | 15/230 |
| 2008/0313833 A1 * | 12/2008 | Shizawa | 15/88.2 |
| 2009/0044830 A1 * | 2/2009 | Wargo et al. | 134/6 |
| 2010/0288305 A1 | 11/2010 | Kobetsky et al. | |

FOREIGN PATENT DOCUMENTS

| | | |
|---|---|---|
| EP | 1693883 A2 | 8/2006 |
| JP | 2007-105624 A | 4/2007 |
| JP | 2007-289878 A | 11/2007 |
| JP | 2008004618 | 1/2008 |
| JP | 2009101253 | 5/2009 |
| KR | 10-0833036 B1 | 5/2008 |
| TW | 200950893 A | 12/2009 |

(Continued)

OTHER PUBLICATIONS

European Patent Office (International Searching Authority), International Search Report & Written Opinion for US2010/034183; Sep. 9, 2010.

(Continued)

*Primary Examiner* — Binh X Tran
*Assistant Examiner* — David Cathey, Jr.
(74) *Attorney, Agent, or Firm* — Klintworth & Rozenblat IP LLC

(57) ABSTRACT

A brush core for engaging and rotating a generally cylindrical brush having a hollow bore is provided. The brush core includes, but is not limited to, a body section forming an outer surface for engaging the hollow bore of the cylindrical brush. The outer surface of the body section includes three or more sides.

18 Claims, 11 Drawing Sheets

(56) References Cited

FOREIGN PATENT DOCUMENTS

| WO | 9940611 A | 8/1999 |
|---|---|---|
| WO | 0203833 A1 | 1/2002 |
| WO | 2005016599 A | 2/2005 |

OTHER PUBLICATIONS

Search Report for Singapore Application No. 201309063-4 dated Dec. 22, 2014, 5 pages.
Machine translation of KR 10-6833036 published May 27, 2008.
Machine translation of JP 2007-289878 published Nov. 8, 2007.

* cited by examiner

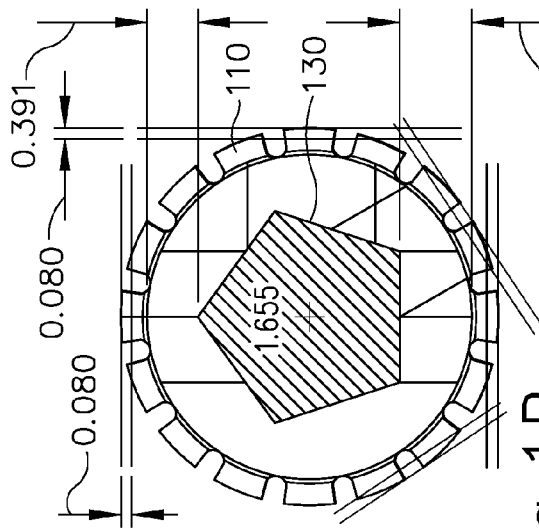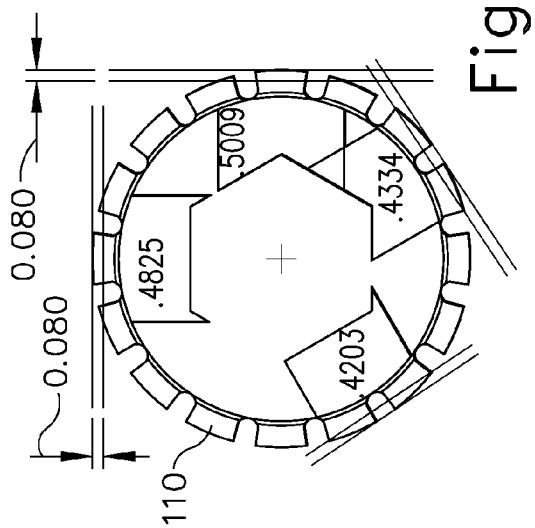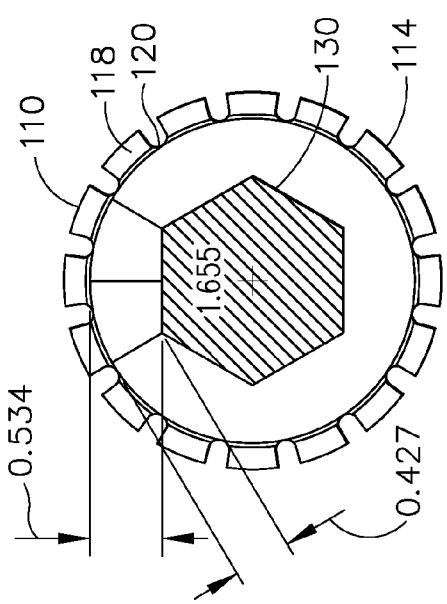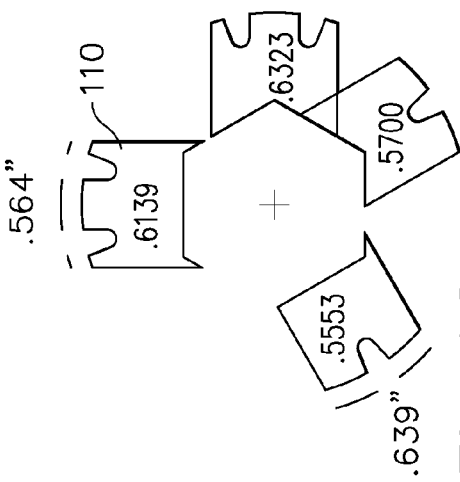

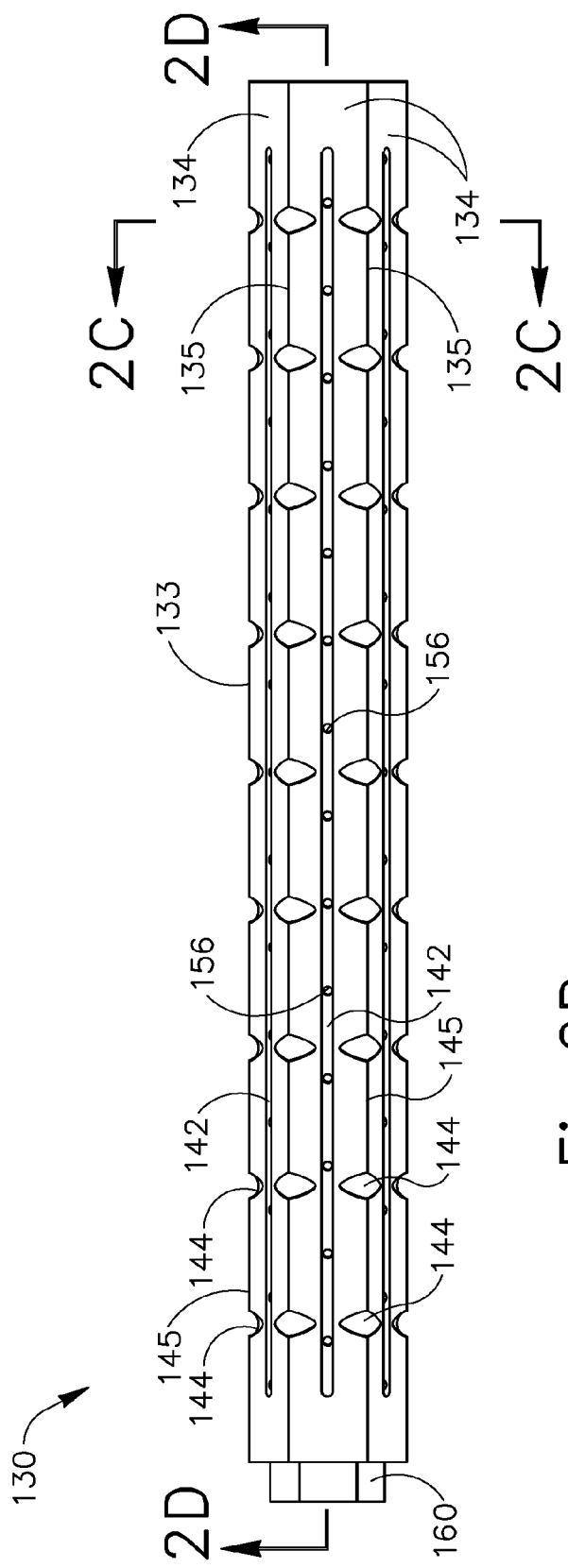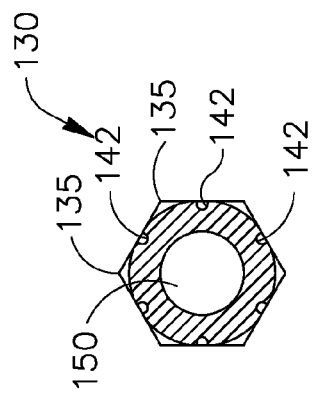
Fig.2B
Fig.2C

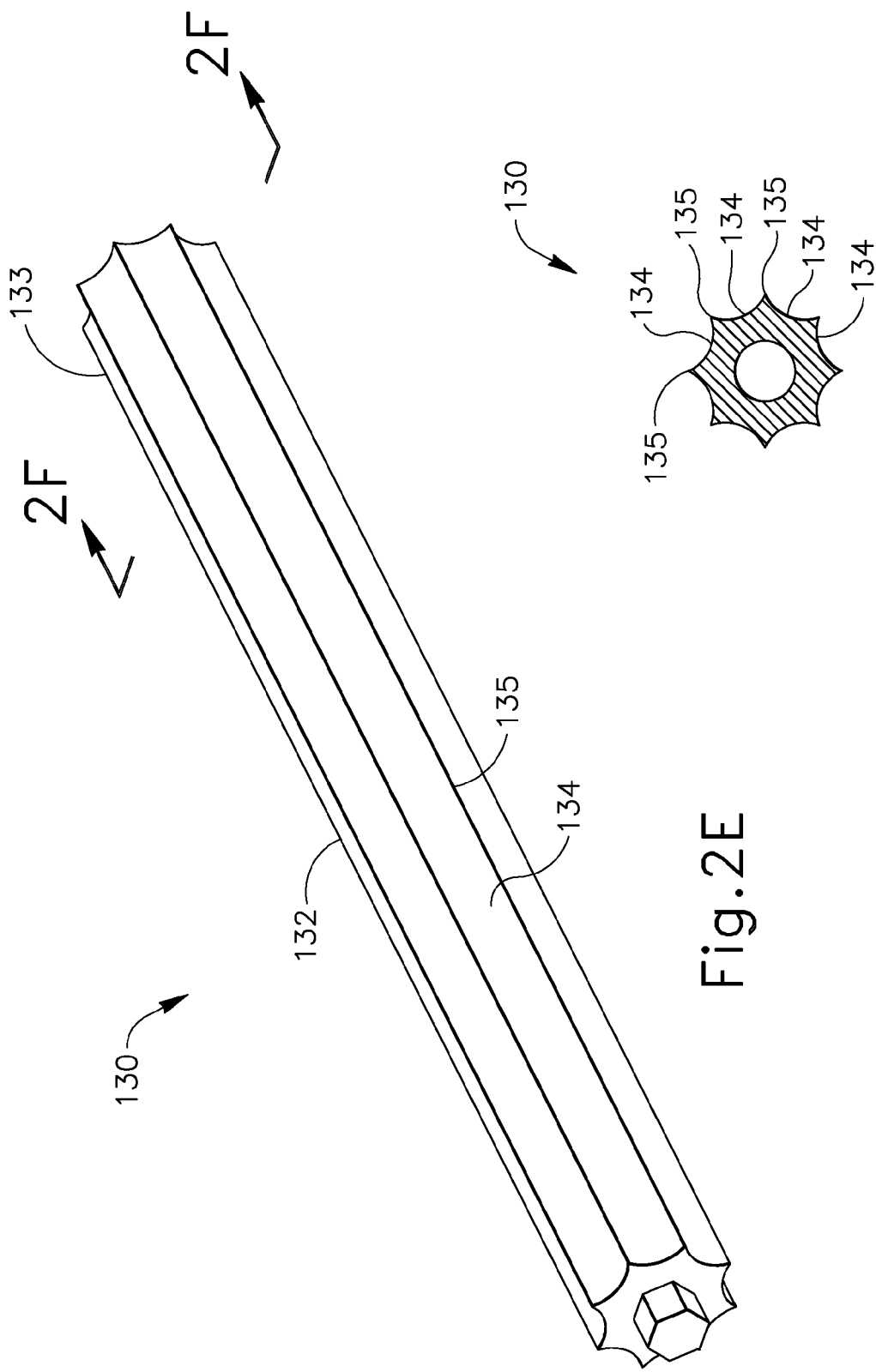

BRUSH CORE AND BRUSH DRIVING METHOD

CROSS-REFERENCES TO RELATED APPLICATIONS

The Present Application claims priority to U.S. Provisional Patent Application No. 61/178,843, filed 15 May 2009. The content of this U.S. Provisional Patent Application is hereby incorporated herein in its entirety.

FIELD OF THE INVENTION

The present invention relates generally to processes and devices for cleaning articles. More specifically, it relates to a brush core for retaining a brush used for cleaning semiconductor substrates.

BACKGROUND

Cast cylindrical polyvinyl alcohol brushes are conventionally used in automatic cleaning systems to provide a post CMP (Chemical Mechanical Planarization) process to effectively clean surfaces of substrates such as semiconductor wafers or other disc-shaped substrates. Cylindrical polyvinyl alcohol brushes are also used in cleaning systems to clean and dry glass and other non-disc-shaped substrates in flat panel display manufacture, glass production, and printed circuit board assembly. Cylindrical brushes preferably have a length as short as 50 millimeters or as long as 10 meters, for example.

The cylindrical brushes are located on and driven by a central brush core in the cleaning process. An accurate and stable connection between the cylindrical brush and the central brush core is desirable. The cylindrical brushes may have nodules on their outer surface to help clean the substrate.

The cylindrical brushes are expected to accurately rotate on their axis and provide a generally cylindrical surface with a generally consistent nodule pressure pattern over their useful life, which defines optimum cleaning of the entire substrate surface in the least amount of time with minimal damage to the substrate surface.

At times, over the life of the cylindrical brush, there will typically be a tendency for the brush to move axially or rotationally by partially slipping on the brush core and this is regarded as unsatisfactory performance. As a result, it would be desirable to have an accurate and stable connection between the cylindrical brush and the central brush core.

SUMMARY

In one aspect, a brush core for engaging and rotating a generally cylindrical brush having a hollow bore is provided. The brush core includes, but is not limited to, a body section forming an outer surface for engaging the hollow bore of the cylindrical brush. The outer surface of the body section includes three or more sides.

In one aspect, a cleaning system for cleaning substrates is provided. The system includes, but is not limited to, a brush having a hollow bore and a brush core having a body section forming an outer surface engaging the hollow bore of the brush. The outer surface of the body section includes three or more sides.

In one aspect, a method for cleaning substrates is provided. The method includes, but is not limited to, engaging a substrate with a cleaning system having a generally cylindrical brush with a hollow bore and a brush core. The brush core has a body section forming an outer surface engaging the hollow bore of the cylindrical brush. The outer surface of the body section includes three or more sides.

BRIEF DESCRIPTION OF THE DRAWINGS

The invention can be better understood with reference to the following drawings and description. The components in the figures are not necessarily to scale, emphasis instead being placed upon illustrating the principles of the invention.

FIGS. 1A-1L depict cross-sectional views of various illustrative brush and core combinations, in accordance with one embodiment of the present invention.

FIGS. 2A-2D depict various views of an illustrative hex brush core, in accordance with one embodiment of the present invention.

FIGS. 2E-2F depict various views of an illustrative splined brush core, in accordance with one embodiment of the present invention.

DETAILED DESCRIPTION

Methods and systems consistent with the present invention overcome the disadvantages of conventional brushes and brush-core systems by eliminating rotational slippage of the brush. In particular, a cylindrical brush is mounted on a brush core having an outer surface with three or more sides, forming a splined or polygonal contour section. The sides meet and form edges which help to better engage the cylindrical brush and prevent slippage between the cylindrical brush and the brush core. The cylindrical brush may have a similar splined or polygonal contour section along an inner surface of the cylindrical brush defining a bore of the cylindrical brush.

Figure 3:
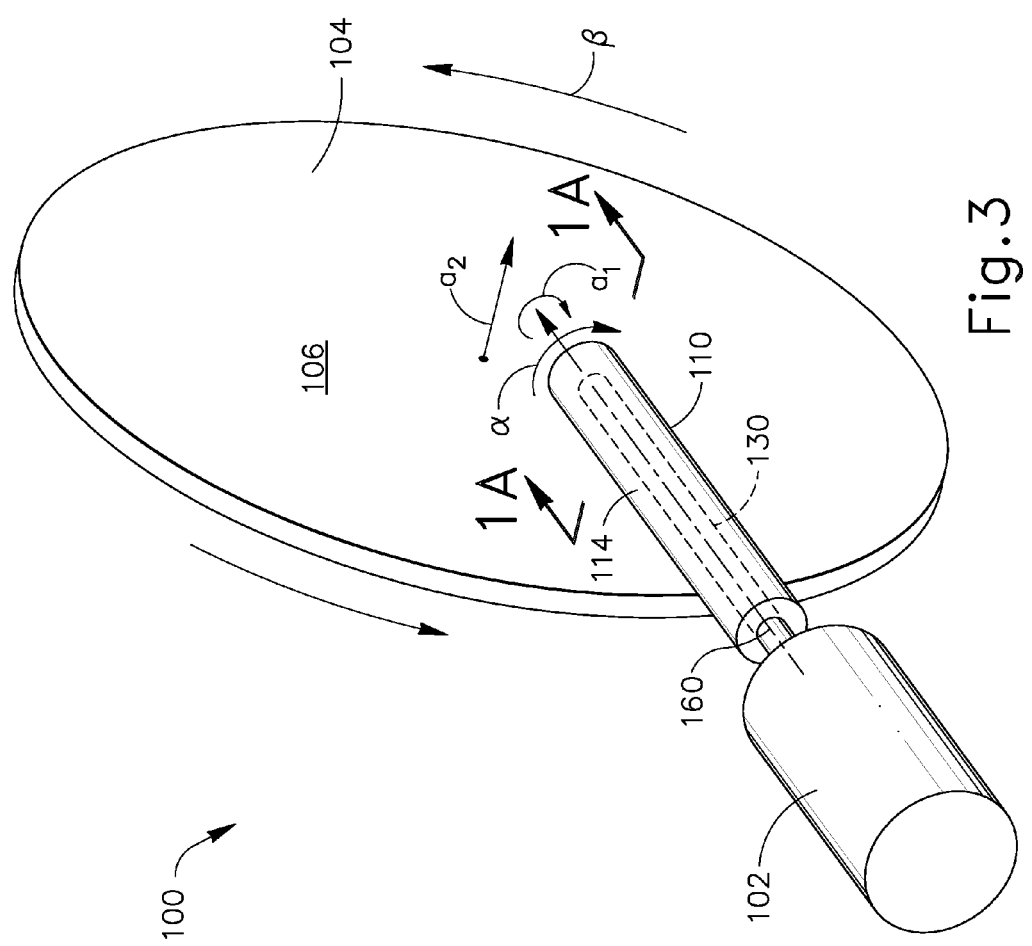
FIG. 3 depicts a perspective view of a cleaning system for cleaning and polishing substrates, in accordance with one embodiment of the present invention.

Referring to FIG. 3, there is shown a cleaning system 100 for cleaning and polishing substrates 104. Preferably, the cleaning system 100 is an automatic cleaning system which can automatically or manually be set to polish and/or clean a substrate 104, and more particularly a surface 106 of the substrate 104. Substrate 104 includes any one of a variety of disc-shaped or non-disc-shaped substrates, such as: silicon based substrates including glass, dry glass, semiconductor wafers, flat panel display glass panels, glass production panels, and printed circuit boards; polymer-based substrates; and various types of semiconductor substrates such as silicon-based semiconductor substrates, single element semiconductor substrates, silicon on insulator (SOI) substrates, III-V semiconductor substrates, II-VI semiconductor substrates, other binary semiconductor substrates, ternary semiconductor substrates, quaternary semiconductor substrates; fiber optic substrates; superconducting substrates; glass substrates; fused quartz substrates; fused silica substrates; epitaxial silicon substrates; and organic semiconductor substrates.

Figure 1E:
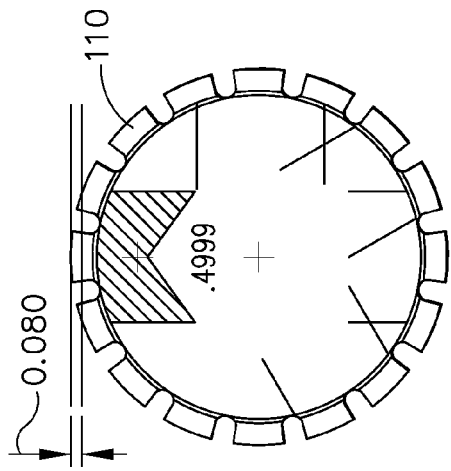
Figure 1F:
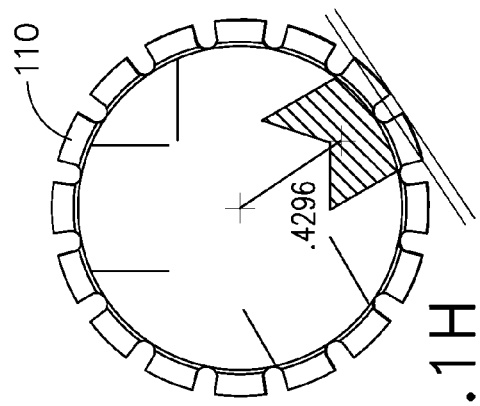
Figure 1G:
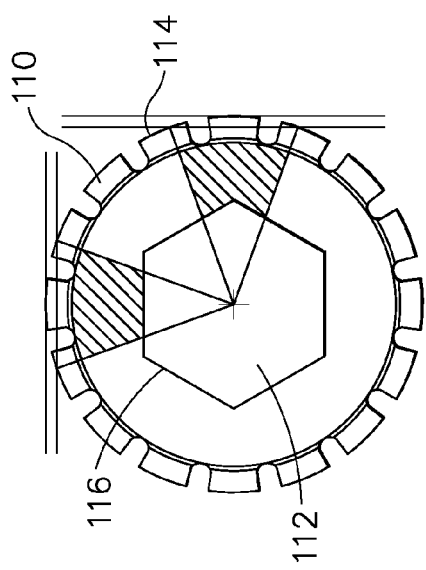
Figure 1H:
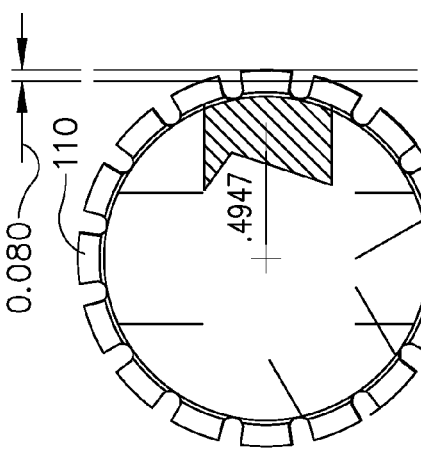
Figure 1J:
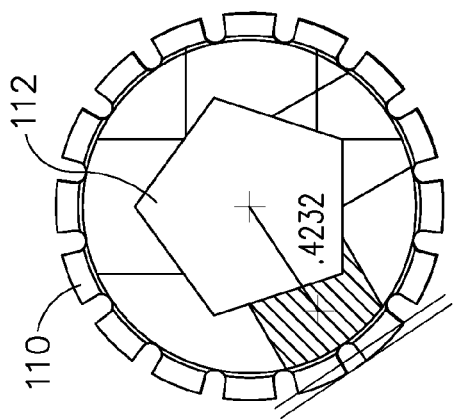
Figure 1L:
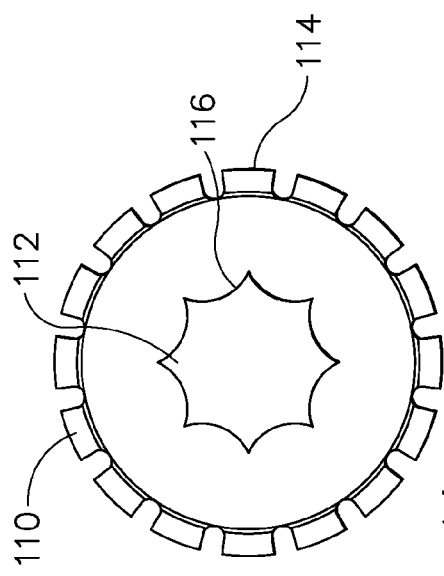
Figure 1I:
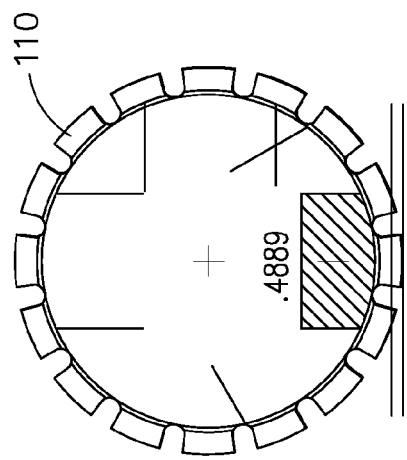
Figure 1K:
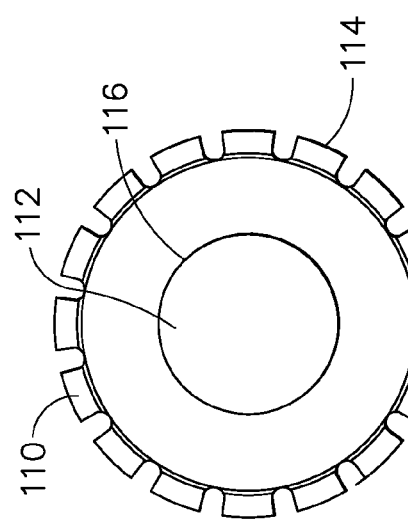

Referring to FIGS. 1A-1L, FIGS. 2A-2F, and FIG. 3, cleaning system 100 includes a generally cylindrical brush 110 having a hollow bore 112, a brush core 130 engaging the brush 110 within the hollow bore 112, and a rotational device 102 engaging the brush core 130. The brush 110 may be any brush which is or may be conventionally used in an automatic cleaning system to provide a post chemical mechanical planarization (CMP) process to effectively clean the surface 106 of substrate 104, such as a cast cylindrical polyvinyl alcohol (PVA) foam brush, or a similar brush. Referring to FIG. 1E, brush 110 includes an outer cleaning surface 114 opposed to an inner engagement surface 116.

Outer cleaning surface 114 may be generally smooth, as shown in FIG. 3, or outer cleaning surface 114 may have nodules 118 with channels 120 formed between the nodules 118, as shown in FIG. 1A. Having nodules 118 with channels 120 may help brush 110 to better clean certain substrates 104. Surface features on the outer cleaning surface 114, such as channels 120, lines, edges, points, or other raised surfaces or nodules 118, may be incorporated and have a beneficial effect at increasing torque transmission levels but may be limited due to their effect on outer cleaning surface 114 geometry changes and also on the difficulty of mounting the brush 110 on the brush core 130.

Inner engagement surface 116 defines the contour of hollow bore 112. Referring to FIGS. 3, 1E, 1K, and 1L, the cross-section of inner engagement surface 116, along a line A-A which is perpendicular to a rotational axis $a_1$ of the brush core 130, defines the contour of hollow bore 112, both of which are circular, splined, or polygonal in shape. Referring to FIG. 1E, the cross-section of inner engagement surface 116 and the contour of hollow bore 112 have a polygonal shape, referring to FIG. 1K the cross-section of inner engagement surface 116 and the contour of hollow bore 112 have a circular shape, and referring to FIG. 1L the cross-section of inner engagement surface 116 and the contour of hollow bore 112 have a splined shape.

Figure 2A:
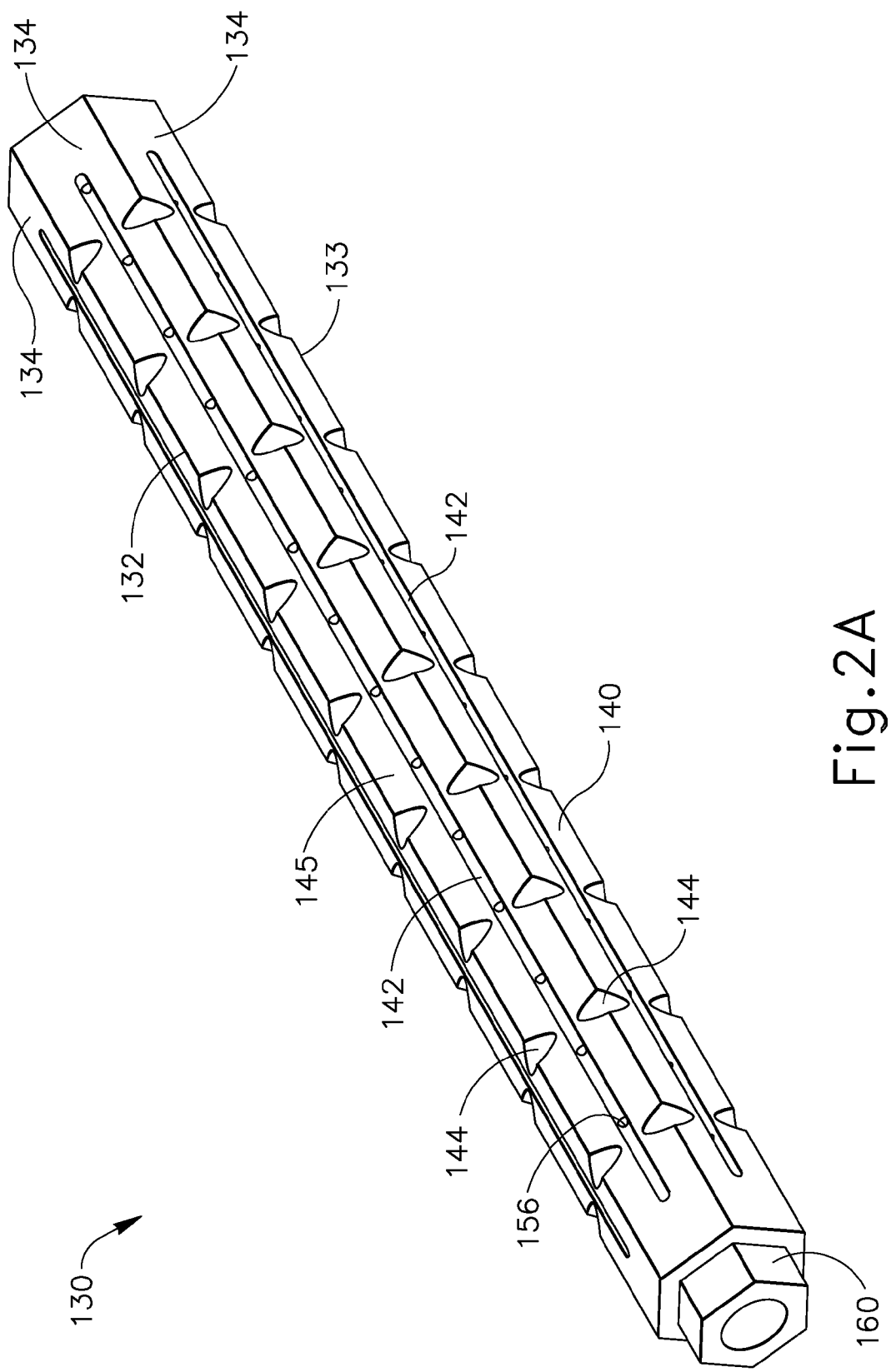
Figure 2D:
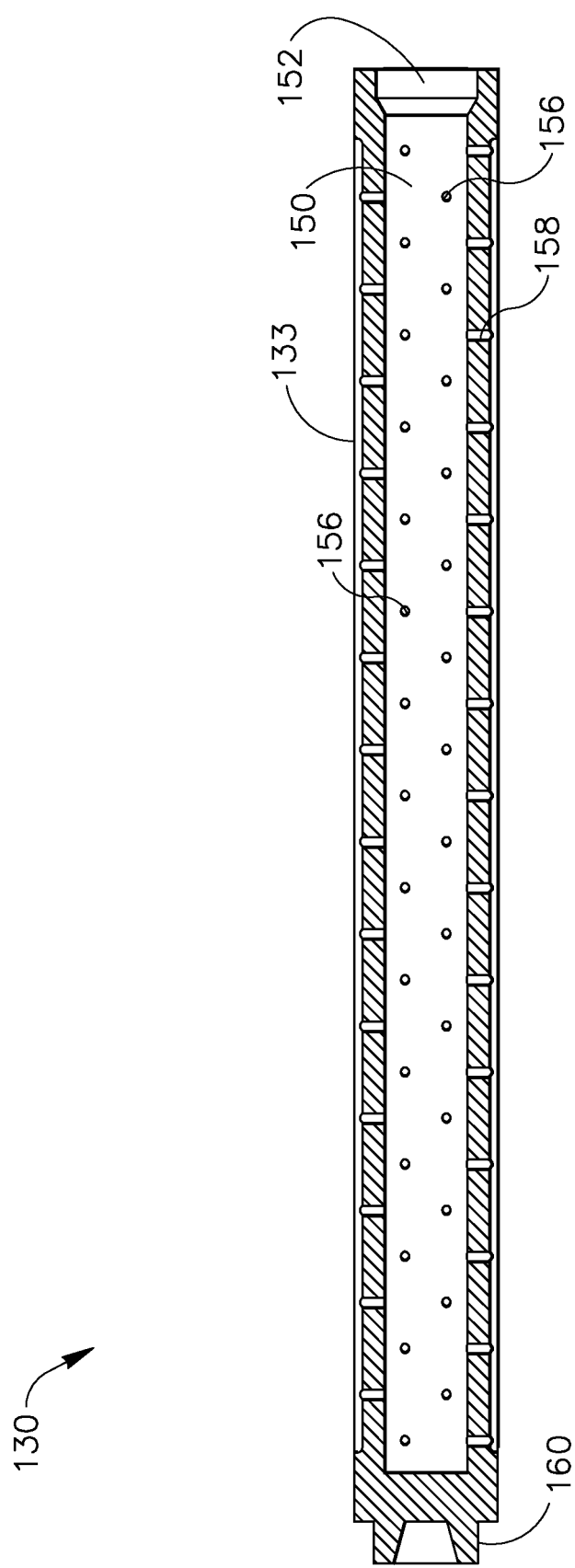

Referring to FIG. 3 and FIGS. 2A-2F, the brush core 130 engages the brush 110 within the hollow bore 112. The brush core 130 includes a body section 132 which forms an outer surface 133 engaging the hollow bore 112 of the brush 110. Referring to FIGS. 3 and 2A-2F, the outer surface 133 of the body section 132 includes three or more sides 134 forming a contour and having a cross-section, along a line A-A which is perpendicular to the rotational axis $a_1$ of the brush core 130, both of which are either splined or polygonal in shape. In one embodiment, the outer surface 133 forms a contour having a splined cross-section, wherein each side 134 of the body section 132 is curved, as shown in FIGS. 2E and 2F. In one embodiment, the outer surface 133 forms a contour having a polygonal cross-section, wherein each side 134 of the body section 132 is generally flat, as shown in FIGS. 2B and 2C. Edges 135 are formed where two sides 134 meet to better engage the inner engagement surface 116 of the brush 110, as shown in FIGS. 2A-2F. By having an outer surface 133 which includes three or more sides 134, edges 135 are formed on the outer surface 133 which help to better engage the inner engagement surface 116 of the brush 110 and prevent slippage between the brush 110 and the brush core 130.

Preferably, the outer surface 133 of the body section 132 includes four or more even number of sides 134, allowing for the body section 132 to apply a more even rotational force onto the surface 106 of the substrate 104 being polished or cleaned.

In addition to edges 135, to further prevent axial movement between the brush 110 and the brush core 130, the profile or contour of the outer surface 133 or each side 134 may be interrupted by a brush engagement member 140. Axial movement is defined herein as movement along a rotational direction α about the rotational axis $a_1$. Brush engagement member 140 is any feature which interrupts the general contour of outer surface 133 in order to better engage the inner engagement surface 116 of the brush 110. Brush engagement member 140 includes such features as a band 142 or a series of bands 142 or a ridge 145 or series of ridges 145 at any number of locations along the outer surface 133 or along a side 134 to effectively axially secure the brush 110 to the brush core 130, as shown in FIGS. 2A-2F and 3.

Bands 142 extend along a length of the brush core 130, parallel to the rotational axis $a1$ of the brush core 130, as shown in FIGS. 2A and 2B. Preferably, pores 156 are formed from the outer surface 133 of the body section 132 to a fluid channel 150 for flowing polishing fluid from the fluid channel 150 to the outer surface 133 of the body section 132 and to the brush 110. Ridges 145 are formed on the outer surface 133 between a pair of depressions 144, as seen in FIG. 2B. The bands 142 and ridges 145 help to better engage the inner engagement surface 116 of the brush 110 by creating an outer surface 133 with interruptions.

As a result of edges 135 and brush engagement members 140, the physical fit between the outer surface 133 of the brush core 130 and the inner engagement surface 116 of the brush 110 provides significant resistance to slipping. This resistance to slipping could be further enhanced by other methods including adhesives, surface preparation of the core (chemical, physical, corona, and the like), or such additional surface features as knurls, sharp edges, hooks, points, keys, or other linking features.

Referring to FIG. 3, in one embodiment the brush core 130 also includes a rotational engagement member 160 for engaging and connecting with a rotational device 102. The rotational engagement member 160 is any device which can be used to connect with or fasten to another device, and includes things such as a nut-shaped piece that is integrally formed with the brush core 130 and can be fastened to the rotational device 102. The rotational device 102 includes any device which can induce a rotational movement onto the brush core 130, such as an electrical motor, a gas motor or engine, a crank shaft power by a motor or manually powered, and any combination of pulleys, wheels, mechanical linkages, and/or gears moved automatically or manually. The rotational device 102 has a complimentary engagement member which connects with the rotational engagement member 160 for engaging and connecting the brush core 130 with the rotational device 102.

Through testing of the brush core 130, the inventors have demonstrated an effective driving connection between the brush core 130 and the brush 110 using a brush core 130 with an outer surface 133 forming a contour having a regular hexagonal cross-section, as shown in FIG. 2C. However, any contour with more than three sides, regular or not, may be used to provide a variety of benefits. In one embodiment, the brush core 130 could have a different contour and cross-section along line A-A than the hollow bore 112 of the brush 110. For example, in one embodiment the brush core 130 may have a polygonal or similar cross-section along line A-A, while the hollow bore 112 of the brush 110 could have a cylindrical cross-section along line A-A. By incorporating a non-cylindrical core-to-brush connection, wherein the brush core 130 includes three or more sides 134, methods and devices consistent with the present invention provide a novel technique that adds another dimension of cleaning efficiency for better cleaning in less time on the same equipment.

The elastic and resilient material of a typical polyvinyl alcohol foam brush 110, when it is expanded during assembly to a rigid brush core 130, reacts in two ways. First, the brush material of the brush 110 at the core near the hollow bore 112 will compress locally; and second, the outside diameter of the brush 110 to the outer cleaning surface 112 will expand a small amount, typically, 60% of the press fit is for compression at the hollow bore 112 and 40% goes to the expansion of the brush 110 and nodules 118 at the outside diameter. A greater press fit between the brush 110 and the brush core 130 provides better and more accurate transmission of drive torque from the rotational device 102 to the outer cleaning surface 114 of the brush 110 into cleaning the surface 106 of the substrate 104, such as a wafer substrate surface.

With the ability to create and control a significant amount of core expansion, methods and systems consistent with the present invention capitalize on cleaning efficiency by creating large, intermittent raised patches or ridges 145 on the surface 133 of the brush core 130 which are reflected in bumps on the outer cleaning surface 114.

Typical radial compression of the outer cleaning surface 114 is 2 mm, and these raised features, such as ridges 145, could add another 1 mm, which would cause an additional, semi-random surface pressure pattern variation in addition to the passing of the rows of regularly spaced nodules 118 to impart an added scrubbing action during the rotation of the brush 110 and the substrate 104. Varying the size of the brush core 130, the shape of the brush core 130, and the ratio of the outer diameter of the brush core 130 to the outer diameter of the brush 110 will result in significant flexibility in changing the profile and contour of the outer cleaning surface 114 and its compression. The pressure pattern formed by the nodule 118 and the radial compression of the outer cleaning surface 114 would thus incorporate a regular overlying pressure variation which could be shown to be beneficial.

Figure 4:
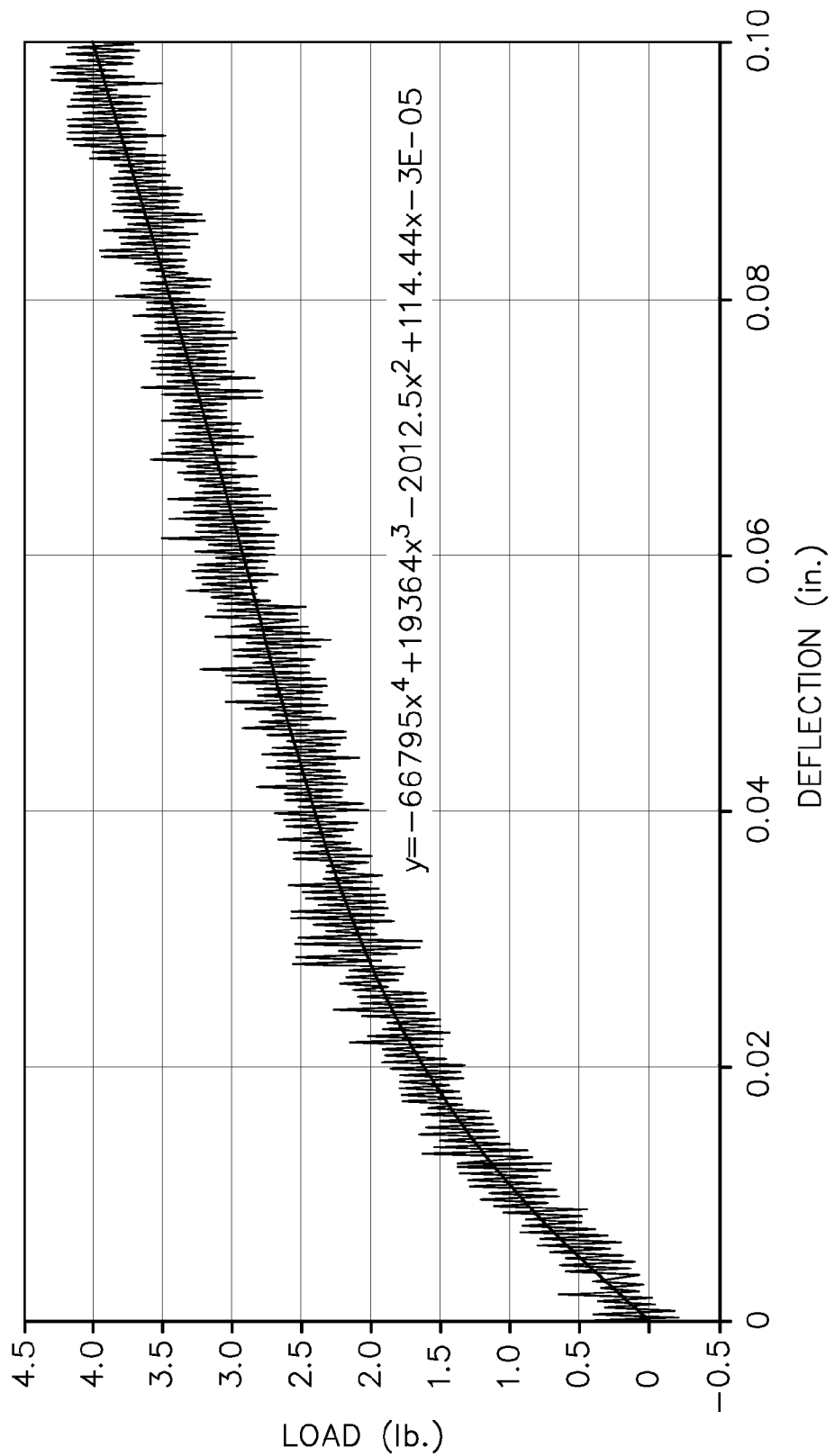
FIG. 4 depicts a load-deflection curve for one ½" disc, in accordance with one embodiment of the present invention.
Figure 5:
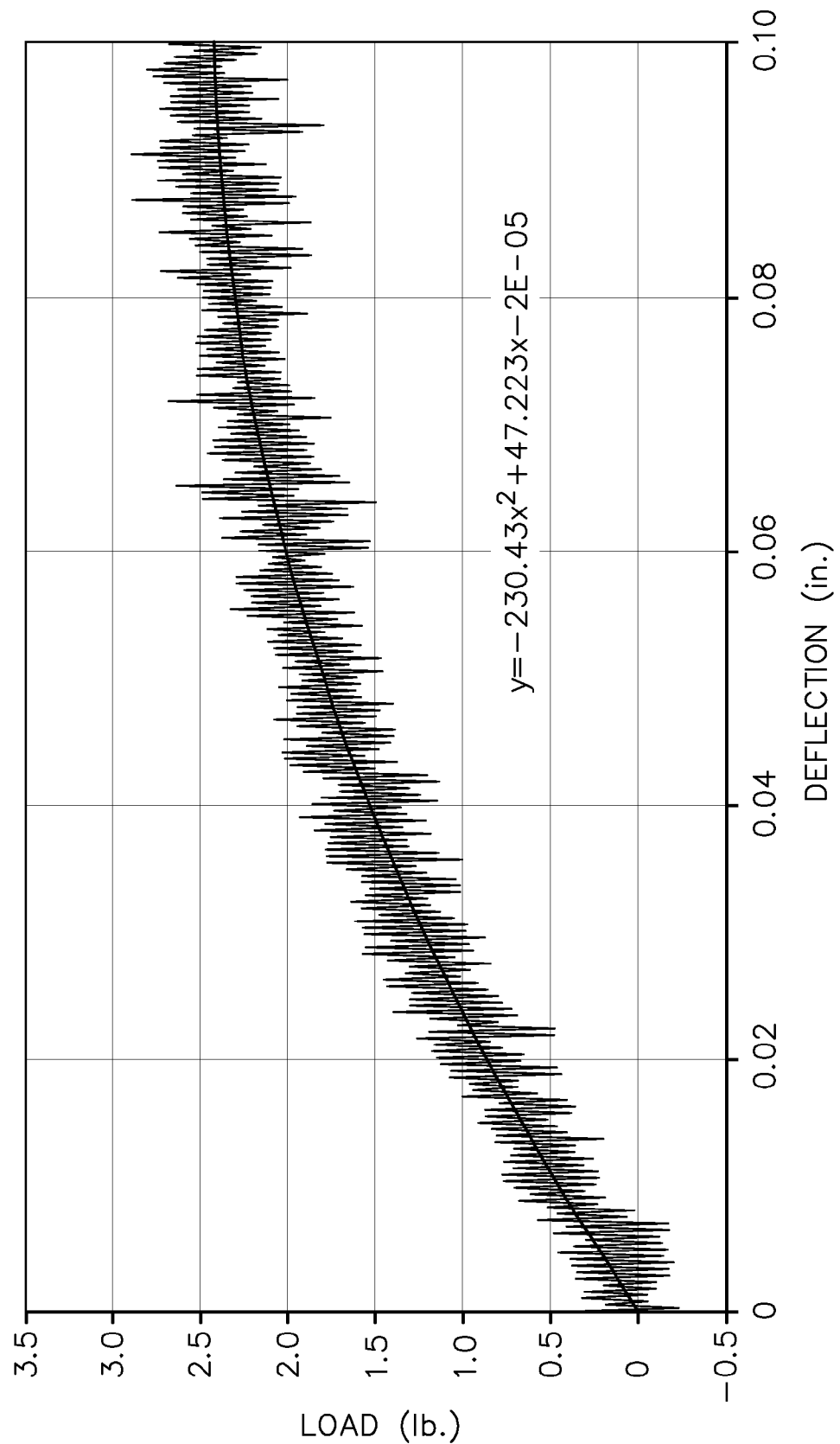
FIG. 5 depicts a load-deflection curve for two ½" discs, in accordance with one embodiment of the present invention.
Figure 6:
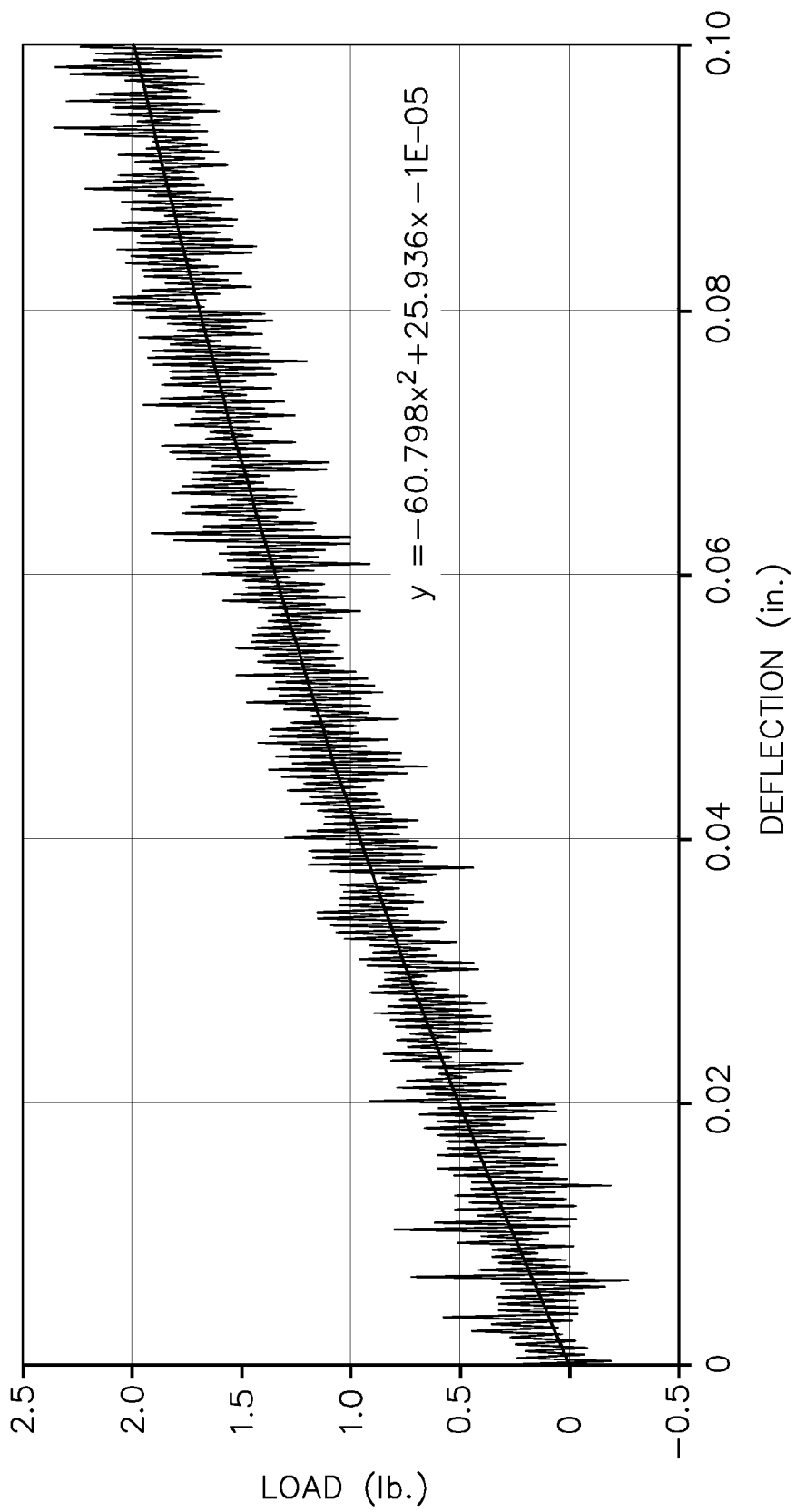
FIG. 6 depicts a load-deflection curve for three ½" discs, in accordance with one embodiment of the present invention.

To elaborate on the above, examples of regular polygonal cross-sections with various brush engaging areas for both pentagonal, splined, and hexagonal cross-section of the brush core 130 are shown in FIGS. 1A-1L. In addition, Load Deflection Curves for when the outer cleaning surface 114 is engaging the surface 106 of substrate 104 are shown in FIGS. 4-6 and depict the resulting pressure from various amounts of brush deflection.

In one embodiment, the brush 110 may be molded onto the brush core 130 in order to prevent slippage between the outer surface 133 of the brush core 130 and the inner engagement surface 116 of the brush 110.

In operation, the brush 110 is mounted to the brush core 130 by inserting the brush core 130 into the hollow bore 112 of the brush 110. Upon insertion into the hollow bore 112, the brush core 130 and the brush 110 are then connected with the rotational device 102 by connecting the rotational engagement member 160 with an engagement member on connecting with the rotational device 102. Then, the brush 110 is rotated along the rotational direction α about the rotational axis $a_1$. While rotating the brush 110, or before rotating the brush 110, the brush 110 is placed near and engages the surface 106 of the substrate 104. The rotational motion of the brush 110 on the surface 106 helps to clean and/or polish the surface 106. Referring to FIG. 3, in one embodiment, the substrate 104 is also rotated along a rotational direction β about a rotational axis $a_2$. In one embodiment, polishing fluid is pumped through fluid channel 150 formed in the body section 132 and into the brush 110 through pores 156 formed through the outer surface 133 of the body section 132 and to the fluid channel 150. The polishing fluid helps to further clean and/or polish the substrate 104.

Although the illustrative examples above describe cylindrical PVA brushes 110 used to clean semiconductor substrates 104, one having skill in the art will appreciate that methods and systems consistent with the present invention are not limited thereto. For example, the brush 110 may include other materials and may be used to clean other types of surfaces 106 or substrates 104. Further, the brush 110 is not limited to having a cylindrical shape, but may have any shape or configuration.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. A brush and brush core comprising:
a one-piece cylindrical brush having a length, and an inner engagement surface defining a hollow bore; the brush being continuous along its length; and
a brush core comprising a one-piece body section having a length and forming an outer surface for directly engaging the inner engagement surface of the cylindrical brush, a rotational axis is defined along the length of the brush core, the outer surface of the one-piece body section defining a perimeter of the one-piece body section and forming a contour along the length of the one-piece body section, the contour including three or more apexes, each apex configured as an edge which directly engages the inner engagement surface of the brush, the apexes extending along the length of the brush core, the contour further including a flat side extending continuously between each set of adjacent apexes, the flat side extending along the length of the brush core, the edges and sides continuously alternating around the perimeter of the one-piece body section.

2. The brush and brush core of claim 1, wherein the outer surface of the one-piece body section is interrupted by at least one brush engagement member.

3. The brush and brush core of claim 1, wherein the one-piece body section forms a fluid channel for receiving fluid along an axis of the one-piece body section, and wherein the b one-piece body section forms a pore from the outer surface of the one-piece body section to the fluid channel for flowing fluid from the fluid channel to the outer surface of the one-piece body section.

4. The brush and brush core of claim 1, further comprising a rotational engagement member extending from one end of the one-piece body section, the rotational engagement member having an outer engagement surface which has two or more sides, the outer engagement surface capable of engaging a rotational device for causing rotation of the brush core and brush.

5. The brush and brush core of claim 2, wherein the brush engagement members are bands or ridges.

6. The brush and brush core of claim 1, further comprising a plurality of spaced apart depressions formed in the outer surface, the depressions being spaced from each other along the length of the brush core.

7. The brush and brush core of claim 6, wherein the depressions are linearly aligned along the length of the brush core.

8. The brush and brush core of claim 6, wherein a plurality of sets of the depressions are provided, each set having depressions which are linearly aligned along the length of the brush core.

9. The brush and brush core of claim 8, further comprising at least one band extending along a predetermined portion of the length of the brush core, the band being formed as an elongated depression in the outer surface of the brush core.

10. The brush and brush core of claim 9, wherein the band separates adjacent depressions around a perimeter of the brush core.

11. The brush and brush core of claim 9, wherein the band does not extend the entire length of the brush core.

12. The brush and brush core of claim 6, further comprising at least one band extending along a predetermined portion of the length of the brush core, the band being formed as an elongated depression in the outer surface of the brush core.

13. The brush and brush core of claim 12, wherein respective bands separate adjacent depressions around a perimeter of the brush core.

14. The brush and brush core of claim 12, wherein the respective bands do not extend the entire length of the brush core.

15. The brush and brush core of claim 1, wherein a plurality of brush engagement members interrupt the outer surface of the one-piece body section, each brush engagement member extending along a portion of the length of the one-piece body section such that each brush engagement member does not extend along the entire length of the one-piece body section.

16. The brush and brush core of claim 1, wherein the plurality of brush engagement members interrupt the edges of the one-piece body section.

17. The brush and brush core of claim 1, wherein the plurality of brush engagement members interrupt the sides of the one-piece body section.

18. The brush and brush core of claim 1, wherein the hollow bore of the brush has a circular contour.

* * * * *